United States Patent [19]

Gardner et al.

[11] Patent Number: 5,055,892
[45] Date of Patent: Oct. 8, 1991

[54] HIGH EFFICIENCY LAMP OR LIGHT ACCEPTER

[75] Inventors: Robert C. Gardner; George E. Smith, both of San Jose; Cheryl L. McLeod, Mountain View, all of Calif.

[73] Assignee: Hewlett-Packard Company, Palo Alto, Calif.

[21] Appl. No.: 399,832

[22] Filed: Aug. 29, 1989

[51] Int. Cl.$^5$ ............... H01L 33/00; H01L 23/28
[52] U.S. Cl. ................................. 357/17; 357/72; 357/74
[58] Field of Search ............... 357/17, 72, 74; 250/552

[56] References Cited

U.S. PATENT DOCUMENTS

| 3,964,157 | 6/1976 | Kuhn et al. | 357/17 |
| 4,094,752 | 6/1978 | Vahe | 357/17 |
| 4,143,394 | 3/1979 | Schoeberl | 357/17 |
| 4,165,474 | 8/1979 | Myers | 357/17 |
| 4,267,359 | 5/1981 | Johnson et al. | 357/17 |
| 4,301,461 | 1/1989 | Asan- | 357/17 |
| 4,638,343 | 1/1987 | Althaus et al. | 357/17 |

FOREIGN PATENT DOCUMENTS

| 0221616 | 5/1987 | France | 357/17 |
| 59-25283 | 2/1984 | Japan | 357/17 |
| 60-4275 | 1/1985 | Japan | 357/17 |
| 61-210685 | 9/1986 | Japan | 357/17 |

OTHER PUBLICATIONS

M. M. Roy et al., "Gallium Arsenide Light-Emitting Diode, *IBM Technical Disclosure Bulletin*", vol. 7, (Jun. 1964), pp. 61–62.

*Primary Examiner*—J. Carroll

[57] ABSTRACT

A lamp has a reflective cup with a light emitting device in the bottom of the cup. A transparent material having an index of refraction n fills the cup and extends to a hemispherical surface with radius R and an equator parallel to the opening of the cup. The reflective walls of the cup project substantially all of the light within a cutoff cone having an included half angle equal to the Brewster's angle of the transparent material. The center of the hemispherical lens surface is spaced from the rim of the opening of the cup a distance R/n. Thus, the opening of the cup is the locus of aplanatic points of the equator if the hemisphere. Most rays from within the cup are incident on the hemispherical lens surface at no more than the complement of the Brewster's angle. Thus, minimal light losses occur at the interface between the transparent medium and air. An aplanatic image is formed outside the hemispherical lens of a virtual source comprising a hemispherical surface extending through the rim of the cup opening. Such optics may also be used for a light accepting device. These principles may also be applicable to a an elongated cavity with a semicylindrical lens of radius R and edges spaced from the edge of the cavity a distance R/n.

24 Claims, 2 Drawing Sheets

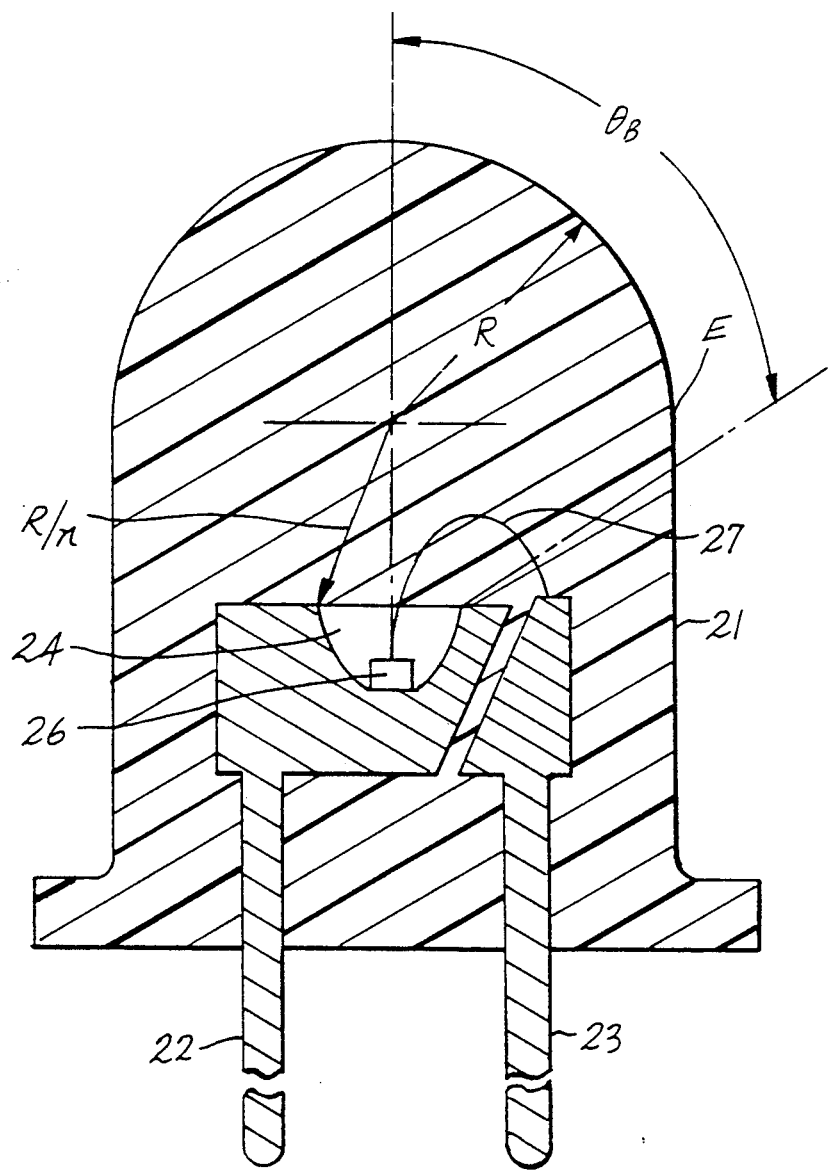

HIGH EFFICIENCY LAMP OR LIGHT ACCEPTER

FIELD OF THE INVENTION

This invention relates to a highly efficient light energy transducer such as a lamp. The optical arrangement is such that substantially all of the light emitted by a light emitter is projected by the lamp. The invention relates to the geometric arrangement of the optical surfaces for efficiently coupling the light from a higher refractive index material into air. The principles are also usable in an embodiment for receiving light.

BACKGROUND OF THE INVENTION

It is almost universally desirable to enhance efficiency of devices. This is true for lamps and particularly for miniature lamps where it is desirable that virtually every photon emitted by the light source be projected by the lamp.

Similarly, it may be desirable to enhance the efficiency of an energy accepting device so that virtually every photon entering the device within a range of angles is absorbed by a meaningful light energy transducer such as a photodetector or means for utilizing the thermal energy obtained by absorbing light.

Reflective optics suitable for concentrating incident light on an energy absorber are described in various papers such as those by V. K. Baranov et al. in the *Soviet Journal of Optical Technology*, Vol. 33, No. 5, pp. 408-411 (1966) and Vol. 34, No. 1, pp. 67-70 (1967); D. E. Williamson "Cone Channel Condenser Optics", *Journal of the Optical Society of America*, Vol. 42, No. 10, pp. 712-715, (Oct. 1952); W. Witte, "Cone Channel Optics", *Infrared Physics*, Vol. 5, pp. 179-185, (1965); and M. Ploke "Light Conductors with Strong Concentration Effect", presented at DGOO convention, Bombay, India, (1966). Standard optics texts describe how to design reflective concentrating systems. Such papers deal primarily with reflective devices for concentrating energy incident on the device within a given angular range onto an absorber of such light. The reflective walls of the device and the absorbers are configured so that essentially every photon entering the device impinges on the absorber directly or after a limited number of reflections from the walls (usually one reflection). Techniques are described for enhancing concentration, namely enhancing the energy density illuminating the absorber.

Similar principles may be employed for designing high efficiency lamps, although the resultant geometry will differ from a practical absorber. In such an embodiment, a light emitting device may be placed adjacent to curved reflective walls so that virtually all of the light emitted by the device is projected by the lamp within a selected angular range.

The published literature describes how to select reflective surfaces for a concentrator such that extremal rays entering the concentrator at the maximum angle of acceptance will be retained within the concentrator and not reflected by its walls back out of the entrance aperture. For purposes of exposition, the angle of such extremal rays which are not reflected out of the concentrator is referred to as the cutoff angle.

A similar cutoff angle can be defined for the reflector of a lamp. For example, a miniature lamp may be in the form of a cup with reflective walls. A light emitting diode (LED) is mounted in the bottom of the cup. The cup walls are curved so that light emitted from the LED either passes directly through the opening or exit aperture of the cup or is reflected from a wall through the opening of the cup (opening and aperture are used substantially interchangeably herein since the opening of the cup is its optical aperture). The depth of the cup and the shape of its walls, particularly in the portion near the aperture of the cup, determine the cutoff angle of light projected from the cup. Thus, for an axisymmetric cup substantially all of the light is projected within a cone having an included half angle corresponding to the cutoff angle. With a well designed, toleranced and manufactured cup, there is very little light outside of this cone. Some light will usually be found outside of the cone due to surface irregularities and aberrations that distinguish real optical systems from ideal optical systems.

It is desirable to have the reflective cup of such a lamp filled with a transparent medium which has a refractive index better matched to the refractive index of the LED than air would be. This enhances the light output of the LED, and hence light output of the lamp. Typically, the cup may be filled with epoxy resin. Eventually the light emitted into the transparent medium is incident on an interface between that medium and air. It is highly desirable to enhance the transmission of light through that interface for obtaining maximum light output from the lamp. This invention addresses that desideratum.

The light from a lamp employing principles of nonimaging reflectors may need to be imaged or directed toward a selected field of view after being projected from the lamp. It is therefore desirable to provide means of association with the lamp for forming an optical image. This desideratum is also addressed by this invention.

It will also be found that principles of this invention may be applicable to devices which accept light energy as well as devices that project light energy.

DEFINITIONS

It is convenient for purposes of exposition of this invention to define certain terms used in this specification.

"Brewster's angle" is a well known term in optics derivable from Snell's and Fresnel's laws. When light transmitted through a medium with low refractive index such as air is incident on the surface of a medium with a higher refractive index, some light may be transmitted and other light reflected. If the angle of incidence is normal to the interface, the maximum amount of light is transmitted, subject only to Fresnel losses. As the angle of incidence increases from the normal, there is little change in the intensity transmitted until one reaches the Brewster's angle.

At that angle, the interaction of the electric vector of the light with the medium causes reflection of light which is substantially polarized. This occurs at an angle where the reflected ray is 90° from the ray transmitted through the higher refractive index material. Since a portion of the light is transmitted and a portion reflected at the Brewster's angle there are "losses" in addition to Fresnel losses and the total light transmitted through the interface is decreased. The amount that is reflected and hence not transmitted increases beyond the Brewster's angle, hence it is desirable to maintain the angle of incidence below the Brewster's angle.

The Brewster's angle is the angle of incidence of light from air onto the transparent medium, the tangent of which is equal to the refractive index of the transparent medium. That is, $\tilde{O}_B = \arctan n$ where $\tilde{O}_B$ is the Brewster's angle and n is the refractive index of the transparent medium.

The same effect occurs when light is incident on the interface from the high refractive index side of the interface. The polarization occurs in the reflected beam at the complement of the Brewster's angle as defined herein. This angle is the angle whose tangent is equal to 1/n. Either the angle where polarized reflection commences within the transparent medium or the angle outside the medium may be referred to as the Brewster's angle. For purposes of this description, the angle outside the medium is referred to as the Brewster's angle. The angle in the higher index medium is the complement of the Brewster's angle.

Another effect occurs when light within the higher refractive index material is incident on the interface to the lower index material. The amount of light that is reflected and hence not transmitted increases beyond the Brewster's angle until all of the light is reflected at what is known as the critical angle. It is at this angle that there is total internal reflection and no light escapes from the higher index material. Clearly, for a lamp it is desirable for all of the light incident on the interface to be at less than the critical angle (as measured from a normal to the surface).

The description herein is largely concerned with transmission of light within the transparent medium. It is convenient in this specification to define a "Brewster cone" as a cone having an included half angle equal to the Brewster's angle of light incident on the transparent material as measured relative to the normal to the interface through which the light is transmitted.

A cutoff angle for a reflective cup is defined above. The cutoff angle for a reflective cup used in a lamp is the angle from the axis of the cup within which substantially all of the light from the cup is projected.

SUMMARY OF THE INVENTION

In practice of this invention according to one embodiment there is provided a lamp comprising a light emitting device (such as a light emitting diode) mounted in the bottom of an axisymmetric cup having a circular opening and reflective walls for emitting light from the opening or aperture of the cup at angles from the axis of the cup up to the Brewster's angle of a transparent material filling the cup. The transparent material has an index of refraction n and extends to a hemispherical surface with a radius R and an equator parallel to the aperture of the cup. The hemisphere has a center spaced from the rim of the aperture of the cup a distance of R/n and is centered over the cup.

With such an arrangement, the rim of the opening of the cup is at the locus of aplanatic points of the hemisphere.

In another embodiment, a light accepting device which has reflective concentrating surfaces, has a cutoff angle corresponding to the Brewster cone with the edge of the reflective surfaces being at the locus of aplanatic points of a hemispherical lens centered on the axis of the cup.

With less than "perfect" imaging devices useful for some purposes, the virtual light source defined by the aperture of the cup may be non-circular, or there may not be a sharp cutoff angle. A cylindrical embodiment employing principles of this invention may also be provided.

BRIEF DESCRIPTION OF THE DRAWINGS

These and other features and advantages of the present invention will be appreciated as the same becomes better understood by reference to the following detailed description of a presently preferred embodiment when considered in conjunction with the accompanying drawings wherein:

FIG. 2 is a longitudinal cross section of another embodiment of this invention.

DETAILED DESCRIPTION

Figure 1:
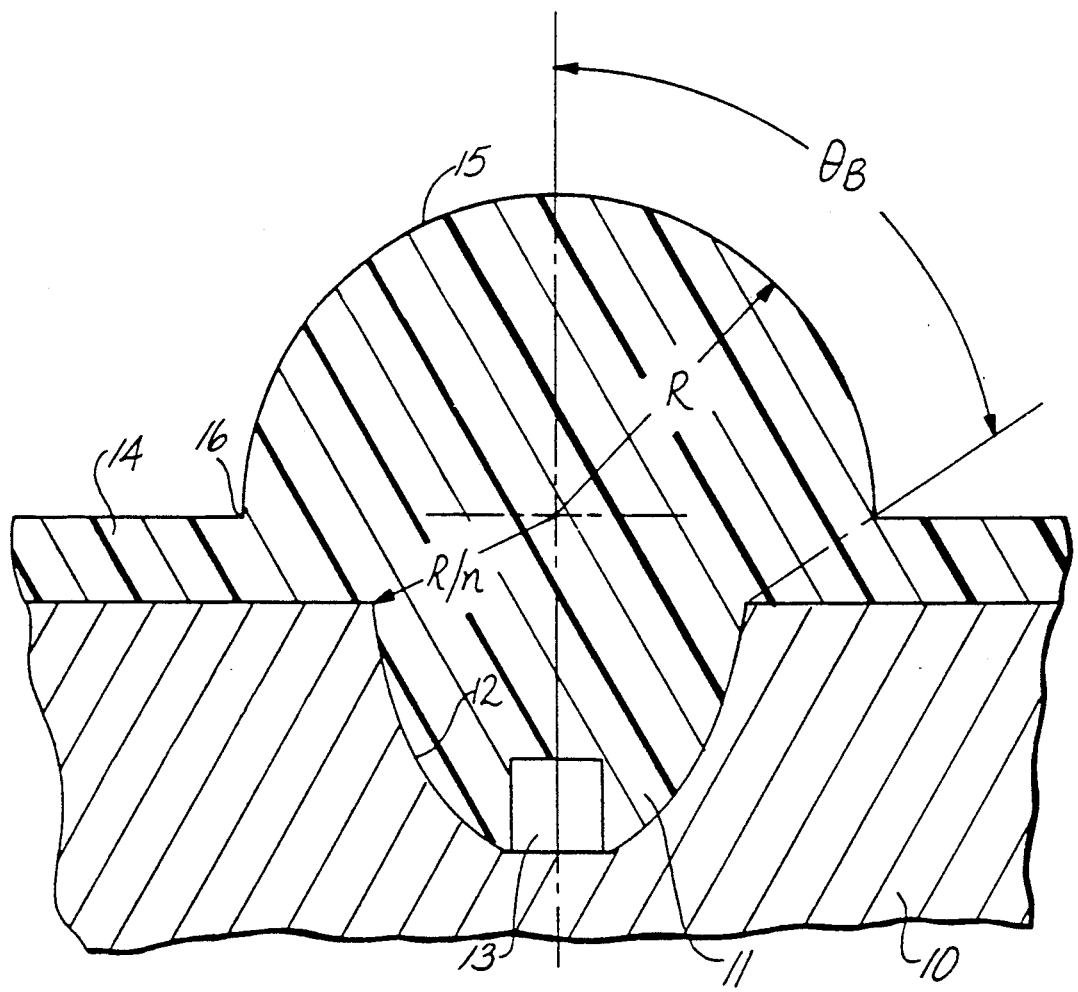
FIG. 1 comprises a longitudinal cross section of a lamp or similar light energy transducing device constructed according the principles of this invention.
Figure 3:
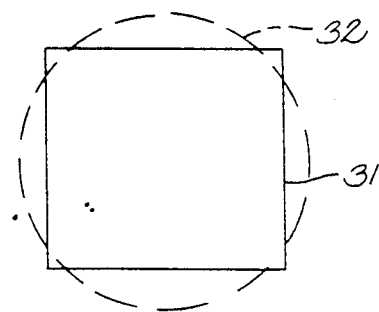
FIG. 3 is a front view of the opening of a square reflective cup.

In an exemplary embodiment, a miniature lamp is formed on or in a metal body 10 which provides structural support and electrical contact. A shallow cup 11 is formed in the front surface of the metal substrate. The cup is axisymmetric and has curved walls 12 which are made highly reflective. Although not material to practice of this invention, the body might be made of plastic and the walls of the cup metallized for reflectivity and electrical conduction.

A light emitting diode (LED) 13 is mounted in the bottom of the cup. The metal body forms one electrical lead for the LED. The other electrical lead (not shown) may be a fine wire bonded to the front face of the LED and extending out of the cup to a nearby anode (not shown). The LED is conventional and may emit light primarily from its front face or may be of transparent material emitting light from the side faces as well as the front face.

The cup is filled with a transparent medium such as an epoxy resin having a higher refractive index than air, which better matches the index of refraction of the LED material and enhances its light output. In this embodiment the transparent medium also extends in a layer 14 across the front surface of the metal, providing electrical insulation and environmental protection.

The transparent medium is also molded to form a hemispherical lens surface 15 of radius R, the center of which is concentric with the axis of the cup. The center of the hemisphere is also at the same distance above the surface of the metal substrate as the thickness of the layer of transparent medium. That is, the equator of the hemisphere is substantially at the front face of the layer of the medium which covers the metal surface.

A typical epoxy resin employed in practice of this invention has a refractive index n of 1.54. The Brewster's angle $\tilde{O}_B$ for such material is therefore 57° and the complement of the Brewster's angle is 33°.

In one preferred embodiment of a lamp, the reflective cup has walls that are curved for reflecting substantially all of the light emitted from the LED toward the circular opening of the cup at the front surface of the metal substrate. The shape of the walls to accomplish this and the light distribution as a function of angle achieved by the reflective walls may be determined by conventional techniques. It is preferred, however, that the cutoff angle of light emitted from the cup should be at the Brewster's angle. That is, substantially all of the light emitted from the aperture of the cup should be within a Brewster cone having an included half angle of 57° for the exemplary epoxy.

The hemispherical lens 15 is positioned so that its equator 16 lies on the Brewster cone extending outwardly and upwardly from the rim of the cup opening. The hemisphere has a radius R. This placement of the equator also means that the distance from the rim of the cup opening to the center of the hemisphere is a distance of R/n. Ordinary geometry may be used to find the radius R that satisfies these conditions for a given diameter of cup aperture.

This geometry employs principles of a Weierstrass or aplanatic sphere. In such a sphere a point at a distance R/n from the center of the sphere is an aplanatic point with its conjugate point outside the spherical lens surface at a distance Rn. In other words, it is a characteristic of a spherical lens that there is a spherical surface outside the surface of the lens which is a stigmatic image of a spherical surface within the lens having a radius R/n. The radius of the outer sphere which images the inner aplanatic sphere is Rn.

With the described location of the hemispherical lens, an extremal ray from the rim of the cup opening is incident on the equator of the spherical lens surface at the complement of the Brewster's angle as defined herein. This means that substantially all of the light incident on the lens surface at the equator, subject only to Fresnel losses, is refracted through the lens surface and imaged at a distance Rn from the center of the sphere and at the Brewster's angle above the plane of the equator.

In such an embodiment any ray from within the cup is incident on the surface of the hemispherical lens at an angle of less than the critical angle, and most of the light is incident on the surface at an angle from the normal to the surface less than the Brewster's angle. As a consequence, almost all of the light emitted from the cup within the Brewster cone passes through the lens surface with only the irreducible Fresnel losses. It will also be noted that a virtual spherical surface having a radius R/n extending into the cup from the rim of the cup opening is imaged stigmatically on a virtual spherical surface of radius Rn outside the spherical lens. This image of light within the cup may be further directed by reflective, refractive or catadioptric means to a desired light distribution. Thus, in addition to enhancing light output from a lamp, the aplanatic lens provides an image of the virtual R/n surface outside the lens and permits one to employ a reflective cup with non-imaging optics for efficient light reflection, and still produce an image which can be directed by conventional optical means.

By having the cutoff angle of light from the cup at the Brewster's angle and the equator of the hemispherical lens lying on the Brewster cone so that the edge of the cup is the locus of aplanatic points of the equator, it is assured that light loss through the epoxy/air interface are minimized. It will be apparent that a somewhat similar arrangement may be used with the cutoff angle a little less than the Brewster's angle and still obtain low light losses. It is preferred to employ the Brewster's angle as the upper limit for minimizing light losses that occur beyond the Brewster's angle.

It may be desirable where a greater thickness of protective layer is needed on the surface or a narrower field of illumination is desired, to use a lens having a spherical surface with the edges of the lens lying within the Brewster cone instead of on it, but with the center of curvature of the lens at a distance of R/n from the rim of the cup opening. In other words, the spherical lens surface does not extend to a full hemisphere. In such an embodiment, the cutoff angle of the cup is preferably the same amount less than the Brewster's angle as the subtended angle of the spherical surface so that the extremal ray is incident on the spherical surface at as high an angle as possible short of the angle where internal reflection takes place.

It is preferred, however, to have the lens in the form of a full hemisphere with the equator at the Brewster's angle from the rim of the cup opening and the center at a distance R/n from all points on the rim. This permits fabrication of a cup with a relatively broader aperture and shallower depth. This is easier to fabricate than a narrower, deeper cup, it eases the attachment of a lead wire to the front surface of the LED, and the manufacturing tolerances for good optical quality are wider for such a cup than for a narrow, deep cup. The hemispherical lens permits the minimum size lamp for a given cup diameter.

An arrangement as provided in practice of this invention permits economical construction of a very small light source of extremely high efficiency. As an example of the dimensions of one embodiment employing an LED in the form of a 250 micron cube, the cup has a depth of 0.71 mm. and its diameter is 1.07 mm. The radius of the hemispherical lens is about 0.89 mm and its center is 0.23 mm above the surface of the metal substrate. The thickness of the protective layer extending away from the equator of the hemisphere is also 0.23 mm. These dimensions are appropriate for an epoxy resin having an index of refraction of about 1.53 to 1.54. Light flux emitted by such a lamp can easily be as much as 92% of the total light from the LED.

In summary, the reflective cup in which the light emitting device is mounted has reflective walls to provide a cutoff angle at the Brewster's angle. The rim of the reflective cup opening is placed on the Weierstrass R/n locus of points of a hemispherical lens. That is, the rim is a circle formed by the R/n points of the hemispherical lens. Stated differently, the rim of the cup opening is at the intersection of the virtual R/n spherical surface with a Brewster's cone passing through the equator of the hemispherical lens. A hemisphere with its equator on the Brewster's cone is used since it is easily manufactured and provides the largest light output for the smallest lamp.

Because of such construction the light hitting the epoxy/air interface has minimal irreducible Fresnel losses. The image of the light emitted from within the cup, essentially in the form of a disk-like virtual light source in the aperture of the cup, may be readily further imaged for a desired light distribution. Light emitted from the cup is found in a smaller solid angle and has increased brightness as compared with a lamp without the appropriately positioned hemispherical lens. There is total control of the light flux without spherical aberrations, coma or astigmatism.

FIG. 2 illustrates in longitudinal cross section another embodiment of lamp constructed according to principles of this invention. This embodiment resembles a conventional "jelly bean" LED lamp, but incorporates a hemispherical end lens positioned as described above for imaging a virtual light source within the lamp. Optically the lamp is similar to the embodiment described and illustrated in FIG. 1 although the mechanical arrangements are different.

The lamp comprises a transparent plastic body 21 with two metal posts 22, 23 for electrical contact extending from the end of the body. The end of one of the posts 22 is upset and has a reflective cup 24 coined into its end embedded within the transparent plastic. A light emitting diode 26 is mounted in the bottom of the cup. The other post 23 connects to a fine wire 27 which is bonded to the LED to make electrical contact. This much of the lamp is conventional.

The curved end of the lamp body is formed as a hemisphere with a radius R. The center of the hemisphere is a distance of R/n from the rim of the cup opening and the principal optical axis of the hemispherical lens is coaxial with the cup. The body of the lamp extends tangentially rearwardly from the equator of the lens.

In this embodiment the center of the hemisphere is above the aperture of the cup so that its equator is within the Brewster cone extending away from the rim of the cup. With such an optical arrangement, the light incident on the lens surface at the equator is at an angle of less than the Brewster's angle. This minimizes internal reflection, and hence increases light output, but makes the lamp larger than if the equator were on the Brewster cone. As indicated above, the smallest lamp is made when the hemisphere equator is on the Brewster cone extending away from the rim of the cup. An important feature of this embodiment is that the exit aperture of the cup is on the virtual R/n spherical surface.

Preferably the cup has a cutoff angle of light emitted from the cup equal to the angle to the equator of the hemisphere. Even in the absence of such a sharp cutoff angle, the hemispherical lens formed on the end of the lamp images the cup aperture at the virtual Rn spherical surface outside the lamp, permitting external imaging optics to be used for directing the light from the lamp in desired directions and patterns.

Although described in specific embodiments in the context of a lamp having a light emitting device concentrated by a Weierstrass hemisphere, it will be apparent that such a refractive arrangement may also be used for a light concentrator or collector. The ray traces through the hemisphere into the reflective cup are directly opposite to the ray traces for a lamp. The rays from within the cutoff cone are refracted into the cup or the virtual image where the Brewster cone from the equator of the hemisphere intersects the R/n surface.

Although high efficiency is enhanced by using a reflective cup with a sharp cutoff angle and the equator of the hemispherical lens on the Brewster cone from the rim of such a cup, principles of this invention may be applied to other devices. For example, a light source may be used which does not have a sharp cutoff angle aligned with the equator of the lens. Light emitted outside of the Brewster cone will not be imaged by the hemispherical lens, but the amount of radiation lost may not be significant for some applications.

In such an embodiment the lens images light passing through the circular area where the Brewster cone intersecting the equator of the lens intersects the R/n surface of the lens when the light lies within the Brewster cone. The R/n surface (or the area inside the rim of the cup) may be thought of as a virtual light source, and the nature of the light emitter, reflective surfaces, etc., behind that virtual light source are not material.

With this in mind, it will be apparent that the aperture of the cup or other virtual light source need not be circular, recognizing that some light may be lost in such an embodiment. Thus, for example, a cup with a roughly square opening 31 may be used. The R/n circle 32 of the Brewster cone would encompass a major part of the area of the square. It might intersect the corners of such a square virtual light source, or more likely, it would overlap the square so that a small area adjacent to each corner lies outside the R/n circle 32, and the virtual light source would comprise four circular arcs connected by four flat sides.

Other polygonal or non-circular openings may also be devised. The image of the virtual light source formed by the aplanatic lens system would be determined by the shape of the opening. Such a system might lose some light and may not be as efficient as the preferred embodiment described, but it may also be useful where a special light distribution is desired in a particular application of such a lamp. Similarly, such an arrangement with a non-circular absorber may be employed in an optical system where the aplanatic lens is used for collecting instead of emitting radiation. This could be useful, for example, in a device where an aplanatic hemisphere is positioned adjacent to a photodetector where the Brewster cone from the equator of the lens encompasses a major part of a photocell lying in the plane where the Brewster cone intersects the R/n surface.

It will also be noted that this description has assumed throughout that the medium outside of the hemisphere is air or vacuum, and has considered only the index of refraction of the medium inside the lens. Clearly, the same principles are applicable where the medium outside the lens has a refractive index greater than one, such as when the system is used under water. The dimensions will be different, but the principles are the same.

These principles may also be applicable for enhancing efficiency of an elongated emitter or collector of radiation. In such an embodiment a transverse cross section through the optical system looks much like FIG. 1 and the LED in FIG. 1 may be changed to any of a variety of light emitters or absorbers. Instead of being a hemisphere, the lens is a semicylinder. The relationship of the edge of the semicylinder and the edge of an elongated virtual source or collector is the same as in the axisymmetric embodiment. One can define a "Brewster wedge" analogous to the Brewster cone. The virtual source is defined by the area inwardly of where the Brewster wedge intersects the R/n cylindrical surface. As an emitter, such an embodiment is not as efficient as when a hemispherical lens is used since some of the light rays along the length of the lens may be totally internally reflected.

It is therefore to be understood that within the scope of the appended claims, the invention may be practiced otherwise than as specifically described.

What is claimed is:

1. An optical device comprising:
   an axisymmetric cup having a closed end, reflective walls and a circular opening defined by a peripheral rim;
   a light energy transducer mounted in the closed end of the cup away from its opening; and
   a transparent medium having an index of refraction n filling the cup and extending beyond the opening of the cup, the medium forming a lens in the form of a spherical surface having a radius R, the center of curvature of the lens being located at a distance R/n from the rim of the cup opening, and the principal optical axis of the lens being coaxial with the cup.

2. An optical device as recited in claim 1 wherein the spherical surface is a hemisphere and the angle of incidence of light from the opening of the cup on an equator of the hemispherical surface is no more than the complement of Brewster's angle.

3. An optical device as recited in claim 1 wherein the energy transducer comprises a light emitter and the reflective walls are arranged from conveying substantially all light emitted by the light emitter out of the cup and toward the spherical lens surface.

4. An optical device as recited in claim 1 wherein the energy transducer comprises a light absorber and the reflective walls are arranged for conveying substantially all light passing into the cup through the lens surface to the light absorber.

5. An optical device as recited in claim 1 further comprising a layer of the transparent medium extending laterally from around an edge of the spherical surface.

6. An optical device as recited in claim 1 wherein the spherical lens surface comprises a hemisphere and the transparent medium extends tangentially from around an equator of the hemispherical surface.

7. An optical device as recited in claim 1 wherein the spherical lens surface comprises a hemisphere, and an extremal ray from the opening of the cup is at Brewster's angle for the transparent medium.

8. A light energy transducing device comprising:
a body having a flat front surface;
an axisymmetric cup-shaped cavity in the front surface of the body, intersecting the front surface in circular rim defining a circular opening, and being closed at the end opposite from the opening;
a light energy transducer in the closed end of the cup away from its opening;
a transparent material having an index of refraction n filling the cup and extending beyond the front surface to a hemispherical surface concentric with the cup axis; and
reflective walls in the cup for conveying substantially all light passing through the opening within a cone having an included half angle equal to Brewster's angle for the transparent material, between the opening and transducer; and wherein
the center of the hemisphere is spaced apart from the rim of the opening a distance corresponding to R/n, where R is the radius of the hemisphere.

9. A light energy transducing device as recited in claim 8 wherein the energy transducer comprises a light absorber and the reflective walls are arranged for conveying substantially all light passing into the cup within the Brewster cone to the light absorber.

10. A light energy transducing device as recited in claim 8 wherein the energy transducer comprises a light absorber and the reflective walls are arranged for conveying substantially all light emitted by the light emitter out of the cup within the Brewster cone.

11. A light energy transducing device as recited in claim 8 further comprising a layer of the transparent material covering the front surface of the body around an edge of the hemisphere.

12. A light energy transducing device as recited in claim 8 wherein the transparent material extends tangentially from around an equator of the hemisphere.

13. An optical device comprising:
an axisymmetric cup having a closed end, reflective walls and a circular opening defined by a peripheral rim;
a light energy transducer mounted in the closed end of the cup away from its opening;
a transparent material having an index of refraction n filling the cup and extending beyond the opening of the cup to form a hemispherical lens having a radius R; and wherein
a hypothetical cone from the rim of the cup opening to an equator of the hemisphere has an included half angle equal to Brewster's angle for the transparent material; and
the walls of the cup are shaped so that substantially all light passing through the cup opening within a cutoff angle equal to the Brewster's angle from the axis of the cup, is conveyed between the opening and the transducer.

14. A lamp comprising:
a reflective cup filled with a transparent material having an index of refraction n, and having a bottom at one end and at the other end a circular opening defined by a peripheral rim;
a light emitting device in the bottom of the cup away from its opening; and
a hemispherical lens having a radius R, an index of refraction n, and having its equator spaced apart from the cup a distance such that the rim of the cup opening is spaced from the center of the equatorial plane of the lens a distance R/n, the space between the lens and the cup also being filled with a material having an index of refraction n.

15. A lamp as recited in claim 14 wherein the reflective cup projects substantially all of its light within the Brewster cone of the transparent material passing through the rim of the cup opening.

16. A lamp comprising:
a light emitting diode;
an axisymmetric cup having a circular opening defined by a peripheral rim with the light emitting diode mounted in a bottom of the cup away from its opening and having reflective walls for emitting light from the opening of the cup at angles up to Brewster's angle from the axis of the cup; and
a transparent material having an index of refraction n filling the cup and extending to a hemispherical surface with radius R and an equator parallel to the opening of the cup and a center spaced from the rim of the opening of the cup a distance R/n.

17. A lamp having reflective surfaces for projecting substantially all of its light within a Brewster cone through a transparent material having an index of refraction, the transparent material having an external hemispherical surface with its equator lying on a Brewster cone, an edge of the reflective surfaces being at the locus of aplanatic points of an equator of the hemisphere.

18. A light absorbing device having reflective surfaces for capturing substantially all light entering the device within a Brewster cone through a transparent material having an index of refraction n and an external hemispherical surface with its equator lying on the Brewster cone, an edge of the reflective surfaces being at the locus of aplanatic points of an equator of the hemisphere.

19. An optical device comprising:
a cavity having reflective walls and an end opening defined by a peripheral rim;
a light energy transducer mounted in a closed end of the cavity away from its opening; and a transparent medium having an index of refraction n filling the cavity and extending beyond the opening of the cavity, the medium forming a lens in the shape of a surface having a radius R, the center of curvature of the lens being located at a distance of substantially R/n from the rim of the cavity opening and centered over the cavity.

20. An optical device as recited in claim 19 wherein the lens surface is a hemisphere and the angle of incidence of light from the rim of the cavity on an equator of the hemispherical surface is about the same as the complement of Brewster's angle.

21. An optical device as recited in claim 19 wherein the lens surface is a semicylinder and the angle of incidence of light from the rim of the cavity on an edge of the semicylindrical surface is about the same as the complement of Brewster's angle.

22. An optical device as recited in claim 19 wherein the energy transducer comprises a light emitter.

23. An optical device as recited in claim 19 wherein the energy transducer comprises a light absorber.

24. An optical device as recited in claim 19 wherein the lens surface is a hemisphere, and the rim of the cavity is polygonal and lies at a distance of approximately R/n from an equator of the hemisphere.

* * * * *